Oct. 29, 1957 S. KARRER 2,811,570

THERMOELECTRIC ELEMENTS AND METHOD OF MAKING SUCH ELEMENTS

Filed Dec. 15, 1954 4 Sheets-Sheet 1

Inventor:–
Sebastian Karrer,
By Dunn, [signature]
[signature] Attys.

Oct. 29, 1957 S. KARRER 2,811,570

THERMOELECTRIC ELEMENTS AND METHOD OF MAKING SUCH ELEMENTS

Filed Dec. 15, 1954 4 Sheets-Sheet 2

Inventor:-
Sebastian Karrer,
By Mann, Jackson, Buttcher & Dienner Att'ys.

Oct. 29, 1957 S. KARRER 2,811,570

THERMOELECTRIC ELEMENTS AND METHOD OF MAKING SUCH ELEMENTS

Filed Dec. 15, 1954 4 Sheets-Sheet 3

Inventor:—
Sebastian Karrer,
By Mason, Jackson, Boettcher & Diener Attys.

THERMOELECTRIC ELEMENTS AND METHOD OF MAKING SUCH ELEMENTS

Filed Dec. 15, 1954 4 Sheets-Sheet 4

INVENTOR.
Sebastian Karrer,
BY Brown, Jackson
Boettcher & Dienner
Attys.

United States Patent Office 2,811,570

Patented Oct. 29, 1957

2,811,570

THERMOELECTRIC ELEMENTS AND METHOD OF MAKING SUCH ELEMENTS

Sebastian Karrer, Port Republic, Md., assignor to Baso Inc., a corporation of Wisconsin Application December 15, 1954, Serial No. 475,540

39 Claims. (Cl. 136—5)

The present application relates to thermoelectric elements and method of making such elements, and is a continuation-in-part of my application, Serial No. 392,648, filed November 17, 1953, now abandoned, in turn a continuation-in-part of my application, Serial No. 302,621, filed August 4, 1952, now abandoned. More particularly, my invention relates to elements for thermoelectric conversion of energy and thermocouples comprising such elements capable of producing relatively large amounts of electric power as compared to thermocouples presently in use.

A primary object is to provide thermoelectric elements exhibiting high power output having a high thermoelectric power with respect to a metal and a low electrical resistivity, both over a wide temperature range.

Another object of the invention is to provide thermoelectric elements of the aforementioned character exhibiting low thermal conductivity compared to a metal and hence high conversion efficiency when utilized for thermoelectric conversion of energy.

Another object of the invention is to provide thermoelectric elements of the aforementioned character which are chemically stable, have good mechanical strength, and are capable of withstanding red heat when suitably shielded from oxygen.

Another object of the invention is to provide thermocouples comprising thermoelectric elements of the aforementioned character, and more particularly thermocouples of high sensitivity in detecting small temperature differences between the junctions thereof.

Another object of the invention is to provide thermoelectric elements of the aforementioned character which can be readily produced from commercially available materials and in which the desired electrical properties are reproducible and controllable.

Another object is to provide thermoelectric elements of semi-metallic compositions and, more particularly, certain binary and ternary compositions having semiconductor-like conductivity.

Another object is to provide thermoelectric generators comprising thermoelectric elements of the aforementioned character.

Other objects and advantages of the invention will become apparent from the following description in which thermoelectric elements of the present invention, composed of lead, and at least one member of the group tellurium, selenium and sulphur, and method of making such elements, are disclosed.

Figures 1, 2, 3:
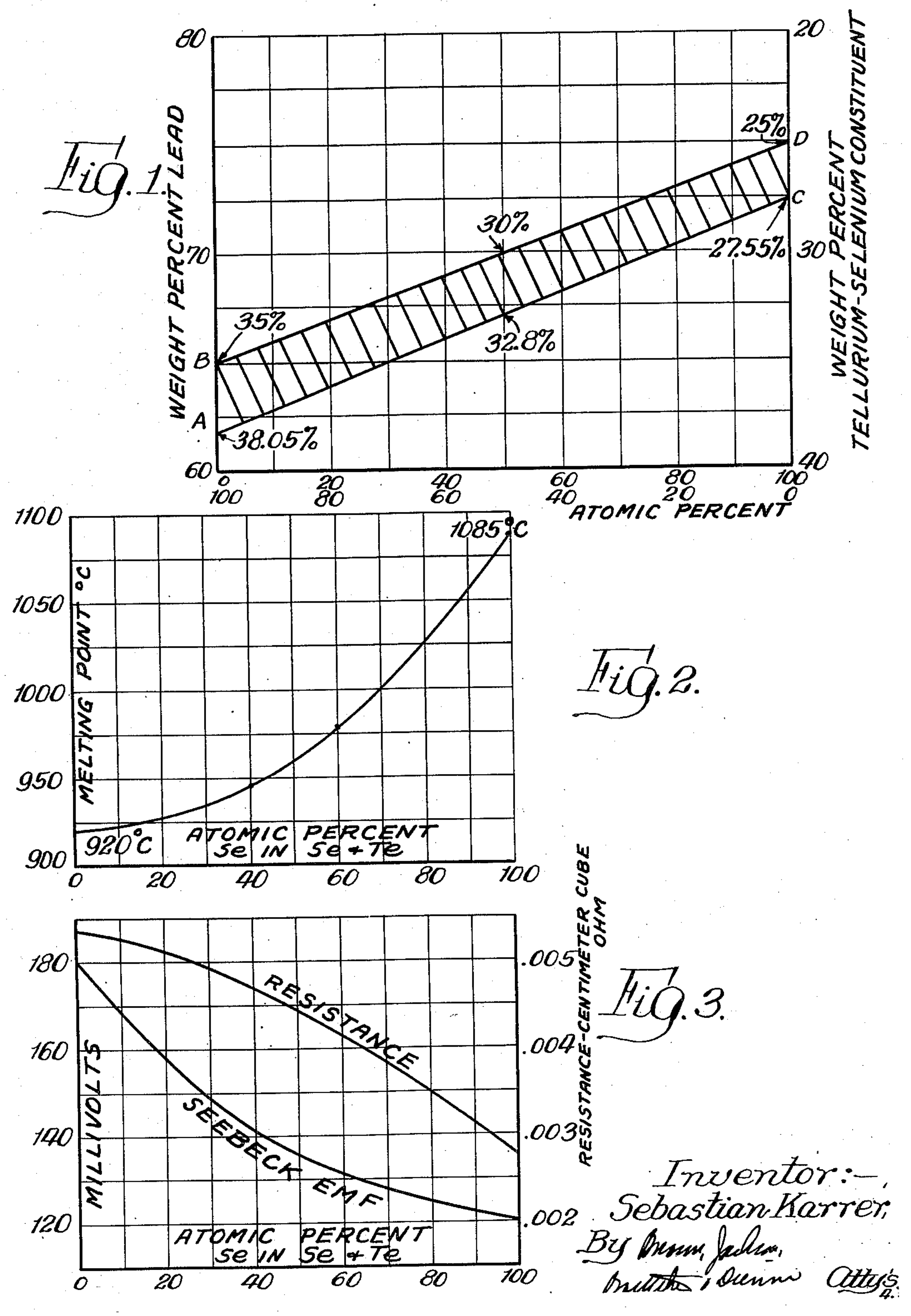
Figure 1 is a graphic illustration of the lead-selenium-tellurium compositions comprising thermoelectric elements of the invention.
Figure 2 is a liquidus curve for the compositions of Figure 1.
Figure 3 is a graphic representation of the salient electrical properties of the compositions of Figure 1.

Thermoelectric generator elements which will afford higher thermal conversion efficiency must exhibit, if possible, at one and the same time high values of thermoelectric power or Seebeck E. M. F., low resistivity and low thermal conductivity. I have found that certain alloys or intermetallic compounds exhibit very favorable relationships between Seebeck E. M. F. and resistivity and simultaneously favorable values of thermal conductivity. Further, I have found that the values of Seebeck E. M. F. and resistivity may be arbitrarily and advantageously altered to afford a wide range of relationships between resistivity and Seebeck E. M. F. without significant changes in thermal conductivity. Metals and metallic alloys exhibit low values of Seebeck E. M. F. and resistivity and simultaneously high values of thermal conductivity. On the other hand, semiconductors exhibit low values of thermal conductivity and high values of Seebeck E. M. F. and resistivity. Thermal conversion efficiency of metals is low because of the high values of thermal conductivity and low values of Seebeck E. M. F. Thermal conversion efficiency of semiconductors is low because of their high resistivities. My invention is based on the fact that I have found a way to alter the electrical properties of certain inter-metallic compounds (which in a pure state exhibit high Seebeck E. M. F. and resistivity and low values of thermal conductivity) to reduce their resistivity without a proportionate reduction in Seebeck E. M. F. or a significant increase in thermal conductivity. These inter-metallic compounds which, in a pure state, are semiconductors, are altered by adding small concentrations of beneficial impurities which render the semiconductor somewhat more metallic in nature, thereby vastly improving the thermal conversion efficiencies. The resulting compositions exhibit high values of Seebeck E. M. F. and low values of resistivity and thermal conductivity in a relationship which cannot be achieved in either pure metals or pure semiconductors. Such resulting compositions I have denominated "semi-metallic" compositions or alloys (to distinguish them from metallic alloys on the one hand and semiconductor alloys on the other hand). Such semi-metallic alloys or compositions afford thermoelectric generator elements affording markedly higher thermal conversion efficiencies and markedly higher electrical output.

The semi-metallic alloys or compositions aforementioned may, I have found, be characterized as binary metallic compounds of slightly imperfect composition, i. e. containing beneficial impurities constituting departures from perfect stoichiometry by reason of an excess of one of the metals over the other. Such semi-metallic compositions have semi-conductor-like conductance (both electrical and thermal, as aforementioned). Semi-metallic alloys or compositions also include mixtures of such binary metallic compounds, which may be denominated, ternary metallic alloys or compositions.

More specifically, I have found especially useful for thermoelectric generators electrical conductors comprising lead and at least one member of the group tellurium, selenium and sulphur, in proportions hereinafter described. As will appear, certain of these alloys or compositions exhibit negative and certain exhibit positive electrical characteristics, thereby affording if desired a compound or double thermoelectric generator unit.

For example, in regard to the thermoelectric properties of lead-tellurium compositions I found that, at a point near the composition corresponding to 61.90% lead, the polarity of the Seebeck E. M. F. reverses, and that compositions of lead and tellurium useful in attaining the above-mentioned objects are those containing between 61.95% and 65.0% lead and the balance substantially all tellurium. More particularly, I found that lead-tellurium compositions within this range afforded high thermoelectric power and low resistivity and are also characterized by good mechanical strength and high chemical stability even at elevated temperatures. For example, a composition containing 63.0% lead, balance substantially all tellurium, after high temperature annealing, has a Seebeck E. M. F. of minus 275 microvolts per degree C. against copper, while a composition containing 61.0% lead, balance substantially all tellurium, has a Seebeck E. M. F. of plus 330 microvolts per degree C. against copper. The composition containing 63.0% lead has a resistivity of about .001 ohm-cm. at room temperature. A centimeter cube of a lead-tellurium composition containing 62.5% lead, balance substantially all tellurium, delivers about 1.5 watts to a match external load when a temperature difference of 555° C. is maintained between opposite faces and said faces connected to an electric circuit. Furthermore, I have found compositions in this range to have compressive strengths greater than 700 kilograms per square centimeter and thermocouple elements of compositions in this range can be operated with the hot junction at 570° C. in an inert or reducing atmosphere. I have further found that, for a negative element, exceeding the range 61.95% to 65.0% lead, balance substantially all tellurium, will not provide elements affording all of the desired electrical and physical properties aforementioned.

While the thermoelectric compositions aforedescribed can be used with any suitable second element in the manufacture of thermocouples, highly efficient thermocouples are those in which the aforedescribed lead-tellurium composition containing from 61.95% to 65.0% lead, balance substantially all tellurium, comprises one of the elements while the second element is one having a high positive Seebeck E. M. F. For this purpose the second element preferably comprises a lead-tellurium composition containing less than 61.8% lead, but preferably at least 58% lead and the balance substantially all tellurium. Such a second element is preferred because of the operating advantages which arise when the two elements possess similar Seebeck E. M. F.'s, resistivities and thermal conductivities. For such a positive element I have found that exceeding the lead range 58% to 61.8%, balance substantially all tellurium, does not provide an element suitable for the intended purpose.

Where it is desired to utilize a suitable known element as the second thermocouple element, a preferred material for such second element is stainless steel. I have found that a thermocouple comprising a lead-tellurium element containing 61.95% to 65.0% lead, balance substantially all tellurium, and a second element of stainless steel operates with a thermal efficiency as high as 2 percent.

I also found that non-metallic impurities ordinarily found in commercial tellurium now available may be present. For example, some contamination of selenium, an element commonly found in commercial tellurium, could be tolerated. In my initial discovery, if such selenium contamination was present in the tellurium utilized, the weight percentage of the lead specified was altered to compensate for the difference in atomic weights of tellurium and selenium, which are 127.61 and 78.96, respectively, and the atomic weight of lead assumed to be 207.21. Conveniently, when selenium, present in tellurium, in amounts of a few percent, is treated simply as a contaminant, the specified weight percent of lead can be adjusted by multiplying the percent by weight of selenium contamination in the tellurium by the factor 0.14 and add the product of this multiplication to the lead percentages above specified.

Proceeding from that finding that selenium is compatible when present in tellurium in providing the aforementioned compositions it follows that suitable thermoelectric elements may be produced containing both selenium and tellurium alloyed with lead, provided that the proportions of these constituents are kept within the ranges hereinafter described, enabling the economic manufacture of thermoelectric elements of the character aforeindicated in that it eliminates the necessity for separating selenium from tellurium and vice versa, a difficult and expensive procedure, and indeed impossible of complete achievement. Accordingly, where the term "trace" is used hereinafter in the specification and claims it is to be understood as meaning amounts of the specified constituents and/or contaminants so small as to defy detection but which must be assumed to be present due to the impossibility of achieving absolute purity.

Referring now to Figure 1, it will be observed that the horizontal coordinate of this graph represents the various proportions of tellurium and selenium given in atomic percent and ranging from tellurium containing but a trace, as above defined, of selenium on the left, to selenium containing but a trace of tellurium on the right. The lefthand vertical scale (in terms of percent by weight) gives the amount of lead which can be alloyed with the selenium-tellurium constituent for any proportions of the latter, while the righthand vertical scale conversely gives the percent by weight of the selenium-tellurium constituent, for any proportions of the latter in the final composition, the remainder being, of course, lead.

For example, a thermoelectric element of lead, selenium and tellurium affording the desired characteristics could consist, as aforedescribed, of a selenium-tellurium constituent in which the selenium is but a trace. In this case such constituent should constitute from 35 percent to 38.05 percent by weight of the composition, as indicated by solid line AB on the diagram of Figure 1, the balance (61.95 percent to 65 percent by weight) being lead. On the other extreme, where the selenium-tellurium constituent consists almost entirely of selenium, with but a trace of tellurium, such constituent should comprise from 25 percent to 27.55 percent by weight of the final composition, as indicated by the solid line CD on the diagram of Figure 1, the remainder (from 72.45 percent to 75.0 percent by weight) being lead. As a further example, where the selenium and tellurium are equal (in atomic percent) in the selenium-tellurium constituent, the latter should constitute from 30 percent to 32.8 percent by weight of the composition, the remainder (67.2 percent to 70 percent by weight) being lead.

The proportions and ranges of the various constituents aforementioned, and those illustrated in the graphic representation constituting Figure 1 of the drawings must be considered as critical if the composition is to have the electrical and physical properties aforementioned. The minimum limits of the lead constituent in the compositions of this invention are represented by solid line A. C. on the diagram of Figure 1 and must be regarded as critical, since, if the lead content is significantly less than this amount for any particular selenium-tellurium proportion the polarity of the Seebeck E. M. F. changes and the desired electrical and mechanical properties will not be reproducible. On the other hand, if the lead content of any composition appreciably exceeds the maximum limit as represented by the solid line BD on the diagram of Figure 1 the resulting composition I have found to be too metallic in nature to afford energy conversion efficiencies satisfying the objects of this invention.

Thus, the utilizable compositions of lead and tellurium-selenium constituents of my invention are represented on the diagram of Figure 1 by the area defined by the solid lines AB, BD, DC and CA.

Not only are the proportions and ranges aforedescribed to be considered critical, but so also is purity. More specifically, the limit of tolerable metallic impurity in the final composition has been found to be on an order of magnitude of 0.01 percent, and the composition must be substantially oxygen-free, if the mechanical and electrical properties desired are to be obtained and be reproducible. Such purity, according to my initial investigation, could be achieved by utilization of lead and tellurium which did not contain metallic impurities exceeding an order of magnitude of 0.01 percent. So also is the limit of tolerable metallic impurities for any selenium utilized. Alternatively, starting constituents of lesser purity may be utilized where the formed composition is put through a recrystallization step, to be hereinafter described, to provide a final or end composition of the order of purity aforeindicated. The final composition or starting ingredients where mentioned in this specification and appended claims are understood to be of the order of purity aforeindicated. Several impurities commonly found in commercial stocks of all three of the constituents will reduce the thermoelectric power derivable from compositions of the present invention, and must be substantially removed by purification. For example, copper is one example of such an impurity having a deleterious effect.

Compositions of lead, selenium and tellurium affording the desired electrical and physical properties aforementioned may be produced by the following method: The starting constituents, free of metallic contaminants as aforeindicated and preferably in a reduced state are mixed together in the proportions indicated hereinabove and sealed in a tube or container, preferably of quartz or Vycor, the container first being evacuated. The tube and its contents are then heated to the melting point of the latter which occurs at a temperature of from about 920° C. to 1085° C. depending upon the proportions of the selenium and tellurium constituents. This is best illustrated in Figure 2, which is a liquidus curve indicating at what temperature a melt of specific composition begins to freeze. During such heating the molten mass is preferably agitated to insure good mixing, and then cooled.

After the composition has been formed as aforementioned, the solidified ingot can be removed from the tube and cast in molds of graphite or the like under an atmosphere of inert gas. More specifically, during casting I have found it preferable to cover the mold with an inert gas such as, for example, argon or carbon dioxide under a positive pressure. This gas suppresses the vaporization rate of the molten composition thereby reducing porosity of the casting.

The aforedescribed alloying and casting steps should be carried out in crucibles which do not react with or contaminate the composition, since, as aforeindicated, minor amounts of undesired impurity may very deleteriously affect the electrical and/or physical properties of the element. Suitable crucibles are, I have found, those made of carbon, Alundum, prefired Lavite and Vycor or quartz.

After casting, the ingots may be machined if necessary. The shaped ingots are then preferably annealed in a reducing atmosphere at from 540° C. to 815° C. for from 10 to 20 hours. This annealing treatment insures homogeneity of the ingot and enhances its electrical and physical properties.

An alternate method of forming the composition comprises melting the constituents as aforementioned in an open crucible under an atmosphere of hydrogen, argon, or any inert and/or reducing gas. Since the vapor pressure of selenium is relatively high and since the formation of $H_2Se$ is favored at high temperatures, some loss of selenium may be encountered and adjustments in the initial amount of this constituent must be made to account for this loss. In all other respects this method is similar to that previously described.

The elements of the invention can be achieved through utilization of starting constituents of such purity that the composition of the resultant element contains no more impurity than that aforeindicated. Alternatively, an element of such purity may be afforded by forming the composition, as will hereinafter be described, from impure starting constituents and reducing the impurity content by recrystallization from the melt. As will be understood by those skilled in the art, this comprises melting the impure composition and causing slow solidification thereof progressively from one end of the melt to the other. This results in a concentration of the impurities of the starting constituents in the region of the last point of the melt to solidify, which region may then be discarded and after which the process may, if further purification is necessary, be repeated. Where this method of purification is employed a small amount of additional lead, that is, from approximately 0.1 percent to 2.5 percent by weight, must then be added to the resultant composition to adjust the same to bring it within the limits aforeindicated.

Thermoelectric elements produced in accordance with the present invention exhibit the desired electrical and physical properties aforementioned. Because of the nature of residual impurities which are difficult to remove the electrical properties of a given composition may vary slightly from batch to batch even though the impurity concentration is limited as aforeindicated and the composition content is held within the minimum and maximum ranges shown in Figure 1. Within such limits, however, the electrical properties are reproducible within about plus or minus 10 percent of the values for the electrical characteristics illustrated graphically in Figure 3 wherein are plotted the Seebeck E. M. F. and resistance of representative compositions annealed as aforedescribed and quenched from a temperature within the annealing temperature range, i. e. about 650° C. In this representation the thermal voltage derived from compositions of the present invention is conveniently expressed in terms of the Seebeck voltage obtained relative to copper when a temperature difference of 555° C. is impressed between the ends of the sample. This thermal voltage, I have found, is governed primarily by the selenium-tellurium proportion in the selenium-tellurium constituent of the composition and is relatively independent of the amount of lead, providing the proportions of lead and selenium-tellurium constituents lie within the limits specified and illustrated in Figure 1.

The electrical resistance of these compositions is also illustrated in Figure 3, wherein it is expresesd in terms of the resistance of a centimeter cube of the composition measured with a 555° C. temperature difference impressed in the direction of current flow. The electrical resistivities of these compositions have positive temperature coefficients.

Compositions of the present invention also exhibit the desired physical properties aforementioned. More specifically they are mechanically strong and stable under operating conditions. The compositions in the mid-range are more brittle and are more resistant to plastic deformation than are compositions at either end. The coefficients of thermal expansion (linear) lie within the range of from $20\times10^{-6}/°$ C. to $16\times10^{-6}/°$ C. Moreover, I have found that compositions of the present invention afford higher thermal efficiencies than do metals because of the low thermal conducitvity of said compositions (about .02 w./cm./° C.).

I have further found that suitable thermoelectric elements affording the objects of this invention may comprise certain lead and selenium-sulphur compositions or alloys within certain ranges of proportions, as will hereinafter be described, and containing not more than 0.01 percent by weight of other matter for reasons which will hereinafter become apparent. It is well known that, on the one hand, sulphur is a common contaminant found in commercially available selenium, and that, on the other hand, selenium is commonly found as a contaminant in commercially available sulphur. It is also well known that it is very difficult and expensive to separate one from the other in order to provide pure selenium free of sulphur or pure sulphur free of selenium. I have found, however, that for purposes of the compositions and electrical conductor composed thereof, which are the subject of this invention, sulphur and selenium are not only compatible, providing the proportions of any selenium-sulphur constituent with respect to the lead content of the composition are kept within certain ranges to be hereinafter described, but that in fact there exists a mutual solubility throughout the entire range to be hereinafter described as between lead and sulphur, on the one hand, and lead and selenium, on the other hand. Proceeding from this finding that selenium is compatible with sulphur in providing compositions which are the subject of this invention, it follows that suitable electrical conductors may be produced containing both selenium and sulphur alloyed with lead, providing that the proportions of these constituents are kept within the ranges hereinafter described, thereby enabling the economic manufacture of electrical conductors of the character aforeindicated in that it eliminates the necessity for separating selenium from sulphur and vice versa, a difficult and expensive procedure and, indeed, impossible of complete achievement. Because of the impossibility of achieving complete separation of selenium from sulphur, the compositions of lead with selenium and sulphur within the ranges to be hereinafter described are to be understood as including at least a trace of either selenium or sulphur. Accordingly, where the term "trace" is used hereinafter in the specification and claims, it is to be understood as meaning amounts of the specified constituents and/or contaminants so small as to defy detection by ordinary methods but which must be assumed to be present due to the impossibility of achieving absolute purity.

Figure 4:
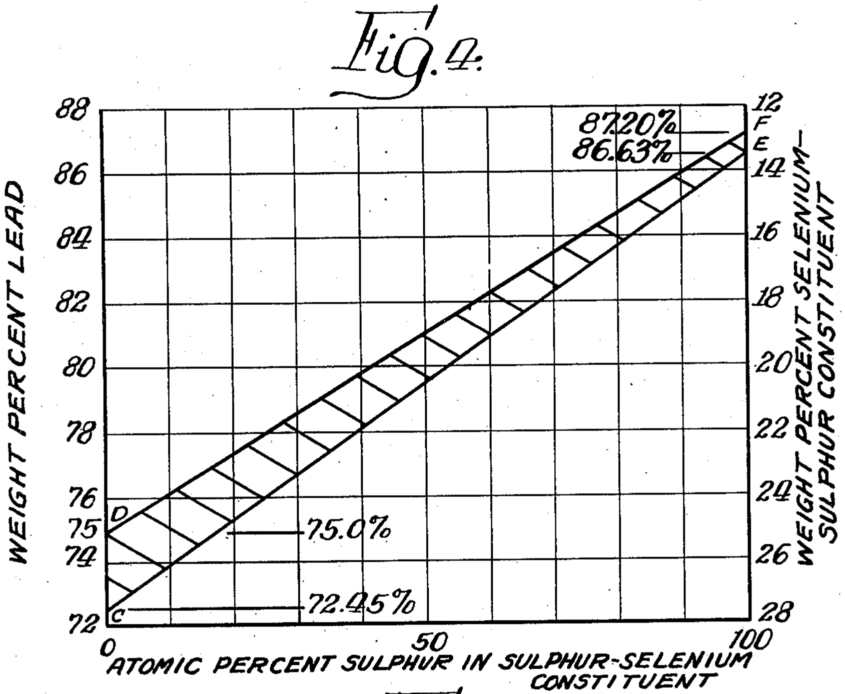
Figure 4 is a graphic illustration of the lead-selenium-sulphur compositions comprising thermoelectric elements of the invention.

Referring now to Figure 4, wherein the usable range of proportions of lead and selenium-sulphur constituents are graphically illustrated, it will be observed that the horizontal coordinate of this graph represents the various proportions of selenium and sulphur given in atomic percent and ranging from selenium containing but a trace, as above-defined, of sulphur on the left to sulphur containing but a trace of selenium on the right. The left-hand vertical scale (in terms of percent by weight) gives the amount of lead which can be alloyed with the selenium-sulphur constituent for any proportions of the latter, while the righthand vertical scale conversely gives the percent by weight of the selenium-sulphur constituent for any proportions of the latter in the final composition, the remainder being, of course, lead.

For example, an electrical conductor of the lead and selenium-sulphur composition affording the desired characteristics could consist, as aforedescribed, of a selenium-sulphur constituent in which the sulphur is but a trace. In this case, such constituent should constitute from 25.0 percent to 27.55 percent by weight of the composition, as indicated by solid line CD on the diagram of Figure 4, the balance (75.0 percent to 72.45 percent by weight) being lead. On the other extreme, where the selenium-sulphur constituent consists almost entirely of sulphur with but a trace of selenium, such constituent should comprise from 12.80 percent to 13.37 percent by weight of the final composition, as indicated by solid line EF on the diagram of Figure 4, the remainder (from 87.20 percent to 86.63 percent by weight) being lead. As a further example, where the selenium and sulphur are equal (in atomic percent) in the selenium-sulphur constituent, the latter should constitute from 18.9 percent to 20.46 percent by weight of the composition, the remainder (81.1 percent to 79.54 percent by weight) being lead.

The proportions and ranges of the various constituents aforementioned and those illustrated in the graphic representation constituting Figure 4 of the drawings must be considered as critical if the composition is to have the electrical and physical properties aforementioned. The minimum limits of the lead constituent in the compositions of the invention are represented by solid line CE on the diagram of Figure 4 and must be regarded as critical since if the lead content is significantly less than this amount for any particular selenium-sulphur proportion, the polarity of the Seebeck E. M. F. changes and the desired electrical and mechanical properties will not be reproducible. On the other hand, if the lead content of any composition appreciably exceeds the maximum limit as represented by solid line DF on the diagram of Figure 4, the resulting composition, I have found, is too metallic in nature to afford electrical characteristics satisfying the objects of this invention.

Thus, the utilizable compositions of lead and tellurium-sulphur constituents of my invention are represented on the diagram of Figure 4 by the area defined by the solid lines CD, DF, FE, and EC.

Not only are the proportions and ranges aforedescribed considered to be critical but so also is purity. More specifically, the limit of tolerable metallic impurity in the final composition has been found to be on an order of magnitude of 0.01 percent and the composition must be substantially oxygen-free if the mechanical and electrical properties desired are to be obtained and be reproducible. Such purity may be achieved by utilization of lead, selenium and sulphur which do not contain metallic impurities exceeding an order of magnitude of 0.01 percent. Alternatively, starting constituents of lesser purity may be utilized where the formed composition is put through a recrystallization step to be hereinafter described to provide a final or end composition of the order of purity aforeindicated. Accordingly, the starting ingredients or, in any event, the final composition where mentioned in this specification and appended claims are to be understood to be the order of purity aforeindicated. Several impurities commonly found in commercial stocks of all three of the constituents will reduce the thermoelectric power derivable from compositions of the present invention and hence must be substantially removed by purification. For example, copper is one example of such an impurity having a deleterious effect.

Lead and selenium-sulphur alloys or compositions within the aforementioned range and of the aforementioned purity are negative electrical conductors and exhibit high negative thermoelectric power, nominally higher electrical resistivity and low thermal conductivity with respect to a metal. Such compositions or alloys have utility as electrical conductors.

Figure 5:
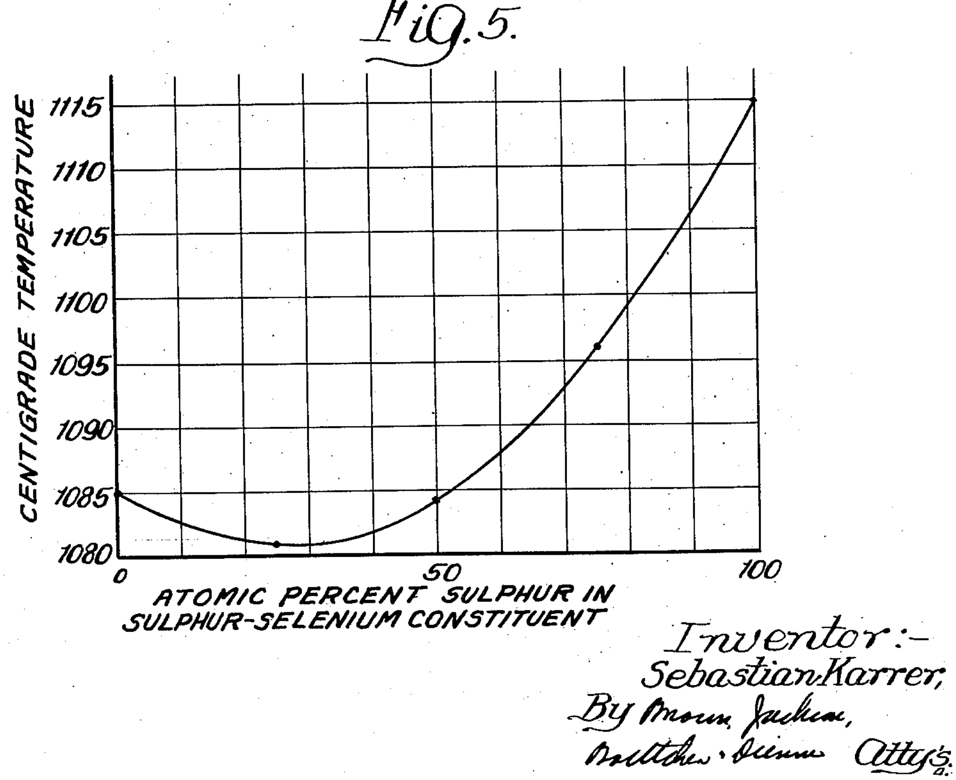
Figure 5 is a liquidus curve for the compositions of Figure 4.

Compositions of lead, selenium and sulphur affording the desired electrical and physical properties aforementioned may be produced by the following method: The starting constituents, free of metallic contaminants as aforeindicated and preferably in a reduced state, are mixed together in the proportions indicated hereinabove and sealed in a tube or container, preferably of quartz or Vycor, the container first being evacuated. The tube and its contents are then heated to the melting point of the latter which occurs at a temperature of from about 1085° C. to 1115° C. depending upon the proportions of the selenium and sulphur constituents. This is best illustrated in Figure 5, which is a liquidus curve indicating at what temperature a melt of specific composition begins to freeze. During such heating the molten mass is preferably agitated to insure good mixing, and then cooled.

After the composition has been formed as aforementioned, the solidified ingot can be removed from the tube and cast in molds of graphite or the like under an atmosphere of inert gas. More specifically, during casting I have found it preferable to cover the mold with an inert gas such as, for example, argon or carbon dioxide under a positive pressure. This gas suppresses the vaporization rate of the molten composition thereby reducing porosity of the casting.

The aforedescribed alloying and casting steps should be carried out in crucibles which do not react with or contaminate the composition, since, as aforeindicated, minor amounts of undesired impurity may very deleteriously affect the electrical and/or physical properties of the element. Suitable crucibles are, I have found, those made of carbon, Alundum, pre-fired Lavite and Vycor or quartz.

After casting, the ingots may be machined if necessary. The shaped ingots are then preferably annealed in a reducing atmosphere at from 540° C. to 815° C. for from 20 to 10 hours. This annealing treatment insures homogeneity of the ingot and enhances its electrical and physical properties.

An alternate method of forming the composition comprises melting the constituents as aforementioned in an open crucible under an atmosphere of carbon dioxide, argon, or any inert and/or reducing gas. Since the vapor pressures of selenium and sulphur are relatively high, some loss of selenium and sulphur may be encountered and adjustments in the initial amount of this constituent must be made to account for this loss. In all other respects this method is similar to that previously described.

The alloys of the invention can be achieved through utilization of starting constituents of such purity that the composition of the resultant alloy contains no more impurity than that aforeindicated. Alternatively, an alloy of such purity may be afforded by forming the composition, as will hereinafter be described, from impure starting constituents and reducing the impurity content by recrystallization from the melt. As will be understood by those skilled in the art, this comprises melting the impure composition and causing slow solidification thereof progressively from one end of the melt to the other. This results in a concentration of the impurities of the starting constituents in the region of the last point of the melt to solidify, which region may then be discarded and after which the process may, if further purification is necessary, be repeated. Where this method of purification is employed a small amount of additional lead must then be added to bring the resultant composition within the limits aforeindicated.

Electrically conductive compositions or alloys and electrical conductors comprising such compositions or alloys produced in accordance with the present invention exhibit the desired electrical and physical properties aforementioned. Because of the nature of residual impurities which are difficult to remove the electrical properties of a given composition may vary slightly from batch to batch even though the impurity concentration is limited as aforeindicated and the composition content is held within the minimum and maximum ranges shown in Figure 4. Within such limits, however, the electrical properties are reproducible within about plus or minus 10 percent of the values for the electrical characteristics illustrated graphically in Figure 6 wherein are plotted the Seebeck E. M. F. and resistance of representative compositions annealed as aforedescribed and allowed to cool slowly to room temperature. In this representation the thermal voltage derived from compositions of the present invention is conveniently expressed in terms of the Seebeck voltage obtained relative to copper when a temperature difference of 555° C. is impressed between the ends of the sample (e. g., one end being at 10° C., the other end at 565° C.). This thermal voltage, I have found, is governed primarily by the selenium-sulphur proportion in the selenium-sulphur constituent of the composition and is relatively independent of the amount of lead, providing the proportions of lead and selenium-sulphur constituents lie within the limits specified and illustrated in Figure 4.

Figure 6:
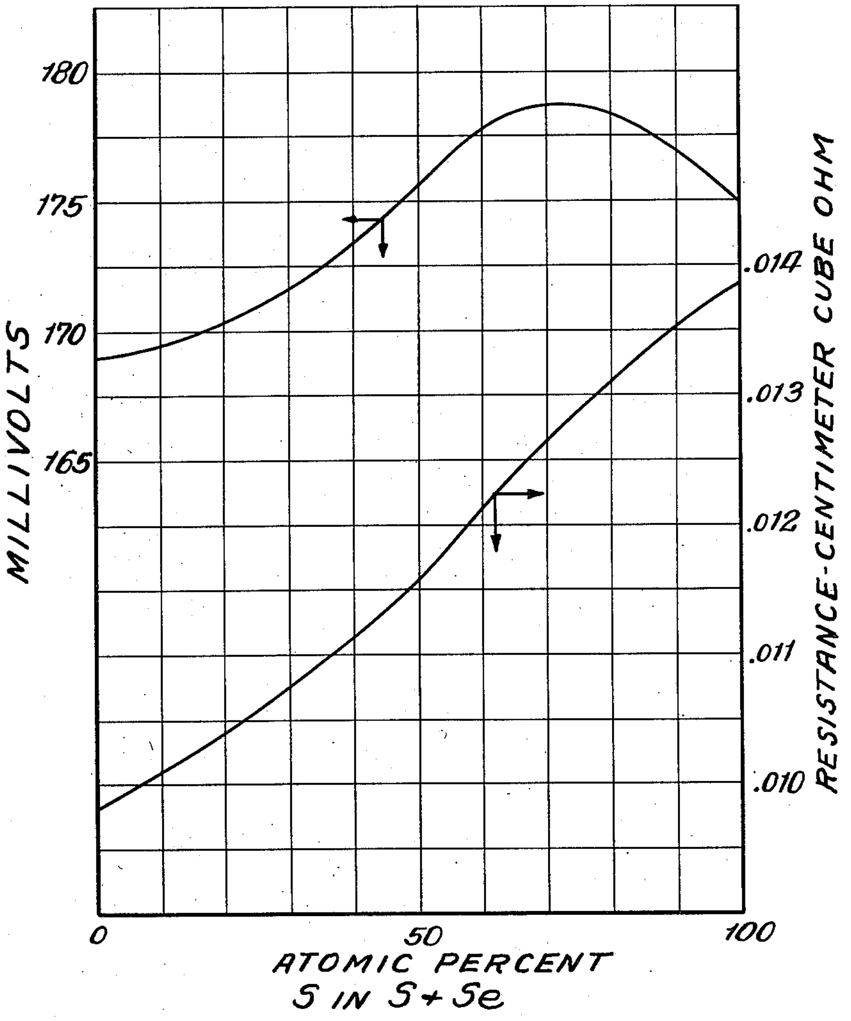
Figure 6 is a graphic representation of the salient electrical properties of the compositions of Figure 4.

The electrical resistance of these compositions is also illustrated in Figure 6 wherein it is expressed in terms of the resistance of a centimeter cube of the composition measured with a 555° C. temperature difference impressed in the direction of current flow. The electrical resistivities of these compositions have positive temperature coefficients.

For convenience the data of the following discussion is given in terms of certain of the aforedescribed compositions, i. e. those represented by solid lines AB, CD and EF at the right and lefthand extremes of Figures 1 and 4. Such compositions may be termed "terminal" compositions and will, for convenience in discussion, be referred to simply as lead-tellurium, lead-selenium, and lead-sulphur compositions, respectively. It will be understood that compositions intermediate such "terminal" compositions exhibit similar characteristics.

In the lead-tellurium alloys of the aforementioned range and purity the magnitudes of the thermoelectric power and electrical resistivity are, I have found, strongly dependent upon the heat treatment afforded the alloy during fabrication, thereby affording control over such properties by the heat treatment. For example, a lead-tellurium alloy within the above-stated range of composition, which has been annealed for several hours at from 540° C. to 815° C. and then quenched, exhibits lower thermoelectric power and electrical resistivity than do the same alloys which have been similarly annealed and then cooled slowly to lower temperatures. The following table, identified as Table I, sets forth representative electrical properties, at room temperatures, of the lead-tellurium alloys aforedescribed as a function of the quenching temperature. The data of Table I represents lead-tellurium alloys which have been annealed at from 540° C. to 815° C. and slowly cooled (e. g. 50° C. per hour) to the indicated temperatures in column 1, and from which temperatures they were quenched.

*Table I*

| Equilibrium Temperature Prior to Quenching | Thermoelectric Power, Microvolts/°C. | Resistivity, Ohm-Cm. |
|---|---|---|
| 815°C | −316 | 0.0023 |
| 704°C | −352 | 0.0034 |
| 538°C | −396 | 0.0074 |
| 427°C | −414 | 0.0150 |
| 316°C | −414 | 0.0173 |
| 204°C | −414 | 0.0175 |

Similarly, in the case of the lead and selenium-sulphur alloys of the aforementioned range and purity the magnitudes of the thermoelectric power and electrical resistivity are, I have found, also strongly dependent upon the heat treatment afforded the alloy during fabrication as aforedescribed, thereby affording control over such properties by the heat treatment. For example, a lead and selenium-sulphur alloy within the above-stated range of composition which has been annealed as aforeindicated for several hours at from 540° C. to 815° C. and then quenched exhibits lower thermoelectric power and electrical resistivity than do the same alloys which have been similarly annealed and then cooled slowly to lower temperatures. The following tables, identified as Tables II and III, set forth representative electrical properties at room temperature of the lead-selenium and lead-sulphur alloys, respectively, aforedescribed as a function of the quenching temperature. These tables are indicative merely of the variation in properties which can be afforded by quenching of the composition from various temperatures, and by way of example. Compositions intermediate the two extremes aforementioned show similar variations in electrical properties. The data of the tables represent lead-selenium and lead-sulphur alloys which have been annealed at from 540° C. to 815° C. and slowly cooled (e. g. 50° C. per hour) to the temperatures indicated in column 1, and from which temperatures they were quenched.

*Table II*

| Equilibrium Temperature Prior to Quenching | Thermoelectric Power, Microvolts/°C. | Resistivity, Ohm-Cm. |
|---|---|---|
| 815° C | −155 | 0.00068 |
| 704° C | −166 | 0.00071 |
| 538° C | −220 | 0.0013 |
| 427° C | −267 | 0.0023 |
| 316° C | −288 | 0.0030 |
| 204° C | −288 | 0.0030 |

*Table III*

| Equilibrium Temperature Prior to Quenching | Thermoelectric Power, Microvolts/°C. | Resistivity, Ohm-Cm. |
|---|---|---|
| 815° C | −144 | 0.00094 |
| 704° C | −162 | 0.0011 |
| 538° C | −198 | 0.0017 |
| 427° C | −225 | 0.0029 |
| 316° C | −280 | 0.0048 |
| 204° C | −280 | 0.0048 |

Figure 7:
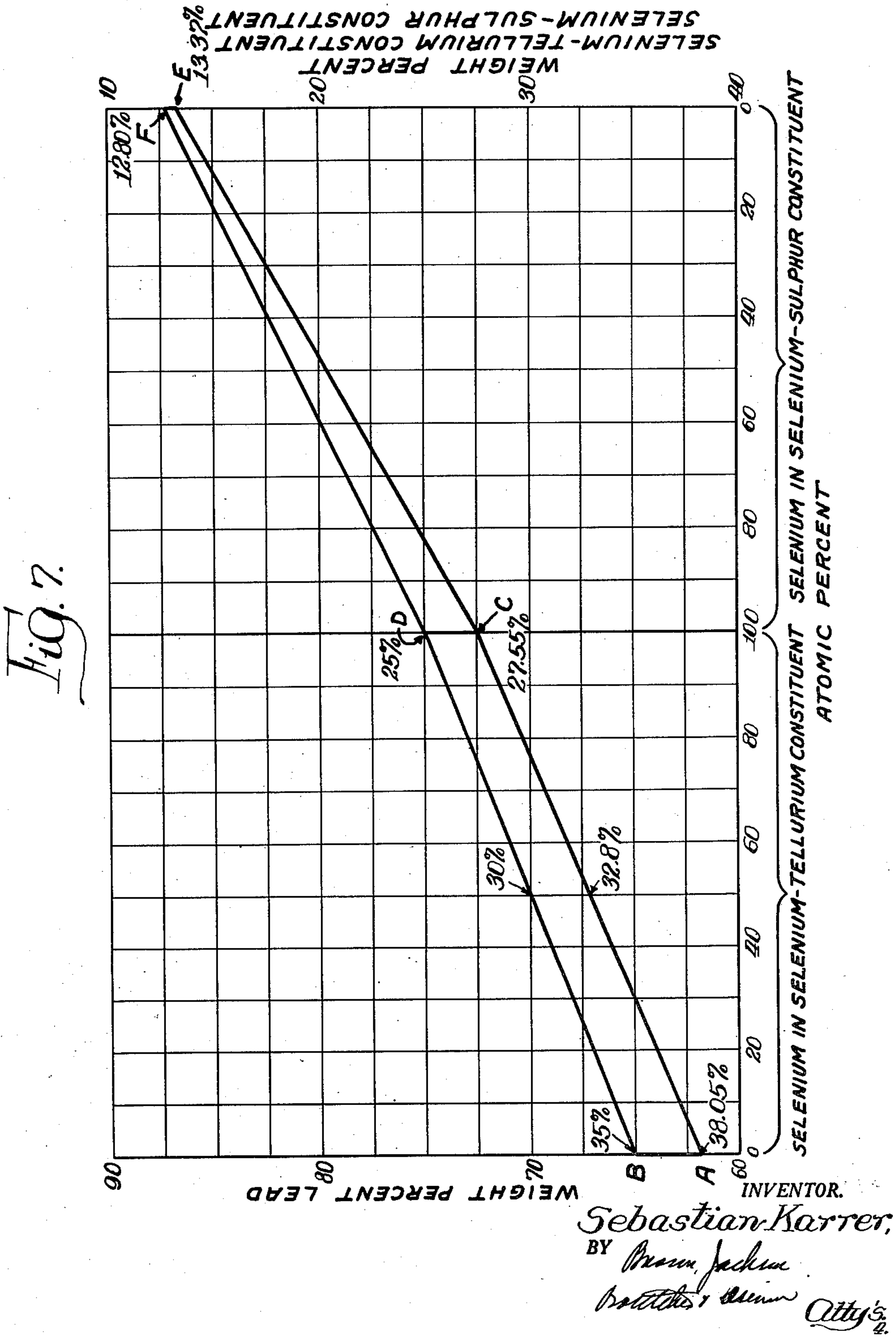
Figure 7 is a bi-axial diagram combining the diagrams of Figures 1 and 4.

It is to be observed that the diagram of Figure 7 combines the diagrams of Figures 1 and 4 with solid line CD of the latter two diagrams being coincidental in Figure 7, whereby it will be recognized that utilizable compositions of the instant invention of lead and at least one member of the group of tellurium, selenium and sulphur are represented on the diagram of Figure 7 by the area defined by solid lines AB, BDF, FE and ECA.

The aforementioned alloys of lead and at least one of the group tellurium, selenium, sulphur, may be best described metallographically as two-phase alloys. It has been observed that these two-phase alloys, when sectioned and examined microscopically, comprise a major phase comprising crystal grains varying usually from 1 to 10 millimeters in size and between such grains there exist thin, relatively darker regions of a second phase. The grains of the primary phase are crystals of the intermetallic compounds lead-telluride, lead-selenide and lead-sulphide (or mixed crystals thereof), which contain approximately 61.89%, 72.41% and 86.60% lead by weight, respectively. The darker second phase, clearly discernible at the grain boundaries, is lead containing a minor concentration of selenium, tellurium or sulphur. The function of the second phase in such alloys is thought to be threefold. First, the thermal equilibrium between the two phases, which is established by the heat treatment aforementioned, induces negative Seebeck E. M. F. and conductivity in the primary lead-telluride, lead-selenide or lead-sulphide phase which, because of its high concentration in the alloy, controls the electrical properties of the two-phase alloy. Secondly, the thin layers act as a cementing agent for the grains of the primary phase, thereby improving the mechanical strength of the alloy when compared with that of the pure intermetallic compound. Thirdly, this cementing action of the second phase affords good electrical conductivity in the polycrystalline alloy by rendering the intergranular component of electrical resistivity negligible. I have found that the actual concentration of second phase is not critical so long as the composition is maintained within the aforementioned specified ranges.

With regard to such aforementioned specified ranges for the various compositions illustrated in Figures 1, 4 and 7, it will be observed that in each case there is an excess of lead over and above the amount thereof necessary for satisfying the stoichiometric proportions of the compound formed with the second constituent or constituents, i. e. the tellurium, selenium or sulphur. Taking by way of example the aforementioned terminal compositions, it will be noted that the first terminal composition (solid line AB) consisting substantially of lead and tellurium contains from 61.95% to 65.0% by weight lead, or from .16% to 8.9% lead by weight of the total composition over and above the 61.89% lead stoichiometrically necessary to combine with the tellurium. Similarly, the terminal composition consisting substantially of lead and selenium (solid line CD) contains from .15% to 10.4% lead by weight of the total composition over and above the 72.41% by weight lead stoichiometrically necessary for combination with the selenium. The same is, of course, true with respect to the terminal composition consisting substantially of lead and sulphur (solid line EF) wherein the amount of lead specified for compositions of the present invention is from .23% to 4.7% lead by weight of the total composition more than that necessary to stoichiometrically combine with the sulphur present, i. e. 86.60% by weight lead. Similarly, for any of the compositions intermediate the aforementioned terminal compositions there exists within the composition ranges specified in Figures 1 and 4 an excess of lead over and above that stoichiometrically necessary to combine with the tellurium-selenium or selenium-sulphur constituent in percent by weight varying according to the relationship of such intermediate composition to the terminal compositions. On the other hand, it will be noted that in the case of the aforedescribed lead-tellurium composition in which the lead is present in amount ranging from 58.0% to 61.8% by weight, there is a stoichiometric excess of tellurium present and the Seebeck E. M. F. and conductivity of the element are positive.

The excess of lead aforementioned inherent in all of the compositions aforedescribed within the ranges thereof graphically illustrated in Figures 1, 4 and 7 and the excess tellurium present in the positive element aforedescribed may be denominated an impurity with respect to the primary lead-telluride, lead-selenide and lead-sulphide phases, as the case may be. Such impurities, however, must be distinguished from the undesired impurities discussed hereinbefore in connection with the required purity requirements of the compositions or alloys. Accordingly, for purposes of this specification and the appended claims such excess lead or tellurium amounts purposely present in the compositions will be denominated "beneficial impurities." As aforeindicated, it is the presence of such beneficial impurities that affords the compositions of this invention their desired electrical characteristics and distinguishes the semi-metallic alloys or compositions of this invention from the primary phase intermetallic compounds lead-telluride, lead-selenide and lead-sulphide. More specifically, such beneficial impurities afford such intermetallic compounds, whether the binary compounds of the terminal compositions or the ternary alloys of the intermediate compositions, a lower resistivity without proportional sacrifice of Seebeck E. M. F. or low thermal conductivity and which results in a composition having what may be termed semiconductor-like electrical conductance or conductivity. It should be noted that such excess lead induces in each of the compositions aforedescribed a Seebeck E. M. F. of negative polarity and negative conductivity, thereby affording a thermoelectric generator element for use with a suitable second element in a thermocouple, which second element may be a metal, for example, stainless steel, or preferably a semimetallic generator element of opposite polarity as, for example, the positive lead-tellurium element aforedescribed in which the lead content ranges from 58% to 61.8%.

From the foregoing characteristics, it will readily be observed that the lead-tellurium-selenium-sulphur elements aforedescribed have particular utility as an element of a thermocouple, it being understood that the second thermocouple element may be of any suitable material, as before stated.

I claim:

1. An electrically negative element consisting essentially of lead and selenium-tellurium constituents, said selenium-tellurium constituent varying linearly in percent by weight of the element with the atomic proportions of selenium and tellurium in said selenium-tellurium constituent and ranging from a minimum of 25 percent and a maximum of 27.55 percent, when the tellurium is but a trace in selenium, to a minimum of 35 percent and a maximum of 38.05 percent, when selenium is but a trace in tellurium, and the balance of said element in each instance being substantially all lead.

2. An element consisting essentially of lead and selenium-tellurium constituents, mixed in proportions as follows: said selenium-tellurium constituent by weight of the element varying linearly in amount with the atomic proportions of selenium and tellurium in said selenium-tellurium constituent and ranging from a minimum of 25 percent and a maximum of 27.55 percent, when the tellurium is but a trace in selenium, to a minimum of 35 percent and a maximum of 38.05 percent, when selenium is but a trace in tellurium, the balance in each instance being substantially all lead, and heated to a temperature of from at least 920° C., when selenium is but a trace in tellurium, to at least 1085° C., when tellurium is but a trace in selenium.

3. The method which comprises alloying lead and selenium-tellurium constituents in which said alloying further comprises, utilizing selenium and tellurium in any proportions with respect to each other and mixing therewith lead in such quantity as to produce an element containing lead ranging from a minimum of 61.95 percent and a maximum of 65 percent by weight of the element, when selenium is but a trace in tellurium, to a minimum of 72.45 percent and a maximum of 75 percent by weight of the element, when tellurium is but a trace in selenium.

4. The method which comprises intimately mixing lead and selenium-tellurium constituents, which step further comprises utilizing a selenium-tellurium constituent in which the selenium and tellurium may be present in any proportion with respect to each other, and varying the amount of lead linearly in amount with the atomic proportions of the selenium and tellurium in said selenium-tellurium constituent, said selenium-tellurium constituent ranging from a minimum of 25 percent and a maximum of 27.55 percent by weight of the mixture, when tellurium is but a trace in selenium, to a minimum of 35 percent and a maximum of 38.05 percent by weight of the mixture, when selenium is but a trace in tellurium, and heating the mixture to a temperature of from at least 920° C., when selenium is but a trace in tellurium, to at least 1085° C., when tellurium is but a trace in selenium.

5. The method according to claim 4 which further comprises annealing the element resulting from the previous steps at a temperature of from about 540° C. to 815° C. for from about 10 to 20 hours to enhance the electrical and physical properties thereof.

6. A thermoelectric generator comprising a first element consisting of lead and selenium-tellurium constituents, said selenium-tellurium constituent varying linearly in percent by weight of the element with the atomic proportions of selenium and tellurium in said selenium-tellurium constituent and ranging from a minimum of 25 percent and a maximum of 27.55 percent, when the tellurium is but a trace in selenium, to a minimum of 35 percent and a maximum of 38.05 percent, when selenium is but a trace in tellurium, the balance of said element in each instance being substantially all lead, and a second element of stainless steel.

7. A thermocouple comprising elements of lead-tellurium composition, one of said elements consisting of from 61.95% to 65% lead, balance substantially all tellurium, and the other consisting of less than 61.8% lead, balance substantially all tellurium.

8. A thermocouple comprising one element consisting of a lead-tellurium composition containing from 61.95% to 65% lead, balance substantially all tellurium, and a second element consisting of stainless steel.

9. The method of producing an electrically negative element which comprises forming a composition consisting essentially of lead and tellurium in the proportions of 61.95% to 65.0% by weight of lead, and the balance tellurium.

10. The method of producing an electrically positive element which comprises forming a composition consisting essentially of lead and tellurium in the proportions of 58.0% to 61.8% by weight of lead, and the balance tellurium.

11. An electrically conductive composition consisting essentially of lead and selenium-sulphur constituents, said selenium-sulphur constituent varying linearly in percent by weight of the composition with the atomic proportions of selenium and sulphur in said selenium-sulphur constituent and raging from a minimum of 12.80% and a maximum of 13.37% when the selenium is but a trace in sulphur, to a minimum of 25.0% and a maximum of 27.55% when sulphur is but a trace in selenium, and the balance of said composition in each instance being substantially all lead.

12. An alloy consisting essentially of lead and selenium-sulphur constituents mixed in proportions as follows: said selenium-sulphur constituent by weight of the alloy varying linearly in amount with the atomic proportions of selenium and sulphur in said selenium-sulphur constituent and ranging from a minimum of 12.80% and a maximum of 13.37% when the selenium is but a trace in sulphur, to a minimum of 25.0% and a maximum of 27.55% when sulphur is but a trace in selenium, the balance of said composition in each instance being substantially all lead and heated to a temperature from at least 1085° C., when sulphur is but a trace in selenium to at least 1115° C., when selenium is but a trace in sulphur.

13. The composition of claim 12 wherein the composition has been annealed at a temperature of from 540° C. to 815° C. and then cooled slowly from said annealing temperature to a temperature within the range of 204° C. to 815° C. and then quenched.

14. The method which comprises alloying lead and selenium-sulphur constituents in which said alloying further comprises utilizing selenium and sulphur in any proportion with respect to each other and mixing therewith lead in such quantities as to produce a composition containing lead ranging from a minimum of 72.45% and a maximum of 75.0% by weight of the composition when sulphur is but a trace in selenium to a minimum of 86.63% and a maximum of 87.20% by weight of the composition when selenium is but a trace in sulphur.

15. The method which comprises intimately mixing lead and selenium-sulphur constituents, which step further comprises utilizing a selenium-sulphur constituent in which the selenium and sulphur may be present in any proportion with respect to each other, and varying the amount of lead linearly in amount with the atomic proportion of the selenium and sulphur in said selenium-sulphur constituent, said lead constituent ranging from a minimum of 72.45% and a maximum of 75.0% by weight of the composition when sulphur is but a trace in selenium in said selenium-sulphur constituent to a minimum of 86.63% and a maximum of 87.20% by weight of the composition, when selenium is but a trace in sulphur in said selenium-sulphur constituent and heating the mixture to a temperature from at least 1085° C. when sulphur is but a trace in selenium to at least 1115° C. when selenium is but a trace in sulphur.

16. The method according to claim 15 which further comprises annealing the composition resulting from the previous steps at a temperature of from about 540° C. to 815° C. for from about 10 to 20 hours to enhance the electrical and physical properties thereof.

17. The method of controlling the electrical characteristics of a lead and selenium-sulphur composition consisting essentially of a selenium-sulphur constituent ranging from a minimum of 12.80% to a maximum of 13.37% by weight when selenium is but a trace in sulphur to a minimum of 25.00% and a maximum of 27.55% by weight when sulphur is but a trace in selenium, the balance in each instance being substantially all lead, which comprises annealing said composition at a temperature of from about 540° C. to 815° C., bringing said composition to equilibrium at a temperature in the range from about 204° C. to said annealing temperature, and then quenching the composition at a temperature selected within the aforementioned equilibrium range.

18. A thermoelectric generator comprising a first element consisting essentially of lead and selenium-sulphur constituents, said selenium-sulphur constituent varying linearly in percent by weight of the element with the atomic proportions of selenium and sulphur in said selenium-sulphur constituent and ranging from a minimum of 25.0 percent and a maximum of 27.55 percent, when the sulphur is but a trace in selenium, to a minimum of 12.80 percent and a maximum of 13.37 percent, when selenium is but a trace in sulphur, the balance of said element in each instance being substantially all lead, and a second element of stainless steel.

19. A thermoelectric element consisting essentially of lead and at least one member of the group tellurium, selenium and sulphur, said lead being present in amount ranging from a minimum of 61.95% and a maximum of 65.0% by weight when the other constituent is substantially all tellurium, to a minimum of 72.45% and a maximum of 75.0% by weight when the other constituent is substantially all selenium, to a minimum of 86.63% and a maximum of 87.20% by weight when the other constituent is substantially all sulphur.

20. The method which comprises alloying lead and selenium-tellurium-sulphur constituents in which said alloying further comprises utilizing constituents selected from the group selenium-tellurium and selenium-sulphur and mixing therewith lead in such quantity as to produce an element containing lead ranging from a minimum of 61.95% and a maximum of 65.0% by weight of the element when selenium is but a trace in tellurium, to a minimum of 72.45% and a maximum of 75.0% by weight of the element when tellurium and sulphur are but a trace in selenium, to a minimum of 86.63% and a maximum of 87.20% by weight of the element when selenium is but a trace in sulphur.

21. A thermoelectric generator comprising at least a pair of thermoelectrically dissimilar members joined to provide a thermoelectric junction, at least one of said members being a semi-metallic element consisting essentially of lead and at least one member of the group tellurium, selenium and sulphur, said lead being present in amount ranging from approximately a minimum of 61.95% and a maximum of 65.0% by weight when the other constituent is substantially all tellurium, to a minimum of 72.45% and a maximum of 75.0% by weight when the other constituent is substantially all selenium, to a minimum of 86.63% and a maximum of 87.20% by weight when the other constituent is substantially all sulphur.

22. The method of controlling the electrical characteristics of a semi-metallic composition consisting essentially of lead and at least one member of the group tellurium, selenium and sulphur in which the lead ranges from a minimum of 61.95% and a maximum of 65.0% by weight when the balance is substantially all tellurium, to a minimum of 72.45% and a maximum of 75.0% by weight when the balance is substantially all selenium, to a minimum of 86.63% and a maximum of 87.20% by weight when the balance is substantially all sulphur, which comprises annealing said composition at a temperature of from about 540° C. to 815° C., bringing said composition to equilibrium at a temperature in the range from about 204° C. to said annealing temperature and then quenching the composition at a temperature selected within the aforementioned equilibrium range.

23. A thermoelectric element consisting essentially of lead and at least one member of the group tellurium, selenium and sulphur in relative proportions with respect to each other in the area defined by solid lines AB, BDF, FE, and ECA in the accompanying bi-axial diagram of Figure 7.

24. The method which comprises alloying lead and selenium-tellurium-sulphur constituents in relative proportions with respect to each other in the area defined by solid lines AB, BDF, FE, and ECA in the accompanying bi-axial diagram of Figure 7.

25. A thermoelectric generator comprising at least a pair of thermoelectrically dissimilar members joined to provide a thermoelectric junction, at least one of said members being a semi-metallic element consisting essentially of lead and at least one member of the group tellurium, selenium and sulphur in relative proportions with respect to each other in the area defined by solid lines AB, BDF, FE, and ECA in the accompanying biaxial diagram of Figure 7.

26. The method of controlling the electrical characteristics of a semi-metallic composition consisting essentially of lead and at least one member of the group tellurium, selenium and sulphur in relative proportions with respect to each other in the area defined by solid lines AB, BDF, FE, and ECA, in the accompanying biaxial diagram of Figure 7, which comprises annealing said composition at a temperature of from about 540° C. to 815° C., bringing said composition to equilibrium at a temperature in the range from about 204° C. to said annealing temperature and then quenching the composition at a temperature selected within the aforementioned equilibrium range.

27. A composition consisting essentially of lead and at least one member of the group tellurium, selenium and sulphur, said lead being present in amount ranging from approximately a minimum of 61.95% and a maximum of 65.0% by weight when the other constituent is substantially all tellurium, to a minimum of 72.45% and a maximum of 75.0% by weight when the other constituent is substantially all selenium, to a minimum of 86.63% and a maximum of 87.20% by weight when the other constituent is substantially all sulphur.

28. A thermocouple comprising a thermoelectric element of a lead-tellurium composition consisting essentially of from 61.95% to 65.0% lead by weight and the balance substantially all tellurium, and in which any deleterious impurity present does not exceed about 0.01% by weight of said composition.

29. A thermocouple comprising a thermoelectric element of a lead-tellurium composition consisting essentially of from 58.0% to 61.8% lead by weight and the balance substantially all tellurium, and in which any deleterious impurity present does not exceed about 0.01% of said composition.

30. An electrically negative element of a lead-tellurium composition consisting essentially of from 61.95% to 65.0% lead by weight and the balance substantially all tellurium, and in which any deleterious impurity present does not exceed about 0.01% by weight of said composition.

31. An electrically positive element of a lead-tellurium composition consisting essentially of from 58.0% to 61.8% lead, balance substantially all tellurium, and in which any deleterious impurity present does not exceed about 0.01% by weight of said composition.

32. A lead-tellurium composition consisting essentially of from 61.95% to 65.0% lead by weight, the balance substantially all tellurium, and in which any deleterious impurity present does not exceed about 0.01% by weight of said composition.

33. A lead-tellurium composition consisting essentially of from 58.0% to 61.8% lead by weight, the balance substantially all tellurium, and in which any deleterious impurity present does not exceed about 0.01% by weight of said composition.

34. A thermocouple comprising elements of a lead-tellurium composition, one of said elements consisting essentially of from 61.95% to 65.0% lead by weight, balance substantially all tellurium, and in which any deleterious impurity present does not exceed about 0.01% by weight of said composition, and the other element consisting essentially of less than 61.8% lead by weight, balance substantially all tellurium, and in which any deleterious impurity present does not exceed about 0.01% by weight of said composition.

35. A thermocouple comprising one thermoelectric element of a lead-tellurium composition consisting essentially of from 61.95% to 65.0% lead by weight, balance substantially all tellurium, and in which any deleterious impurity present does not exceed about 0.01% by weight of said composition, and a second thermoelectric element consisting essentially of stainless steel.

36. An alloy, consisting essentially of lead and selenium, the percent by weight of lead being from 72.45% to 75.0%, the balance substantially all selenium, and the alloy containing no more than about 0.01% by weight of other matter.

37. An alloy, consisting essentially of lead and sulphur, the percent by weight of lead being from 86.63% to 87.20%, balance substantially all sulphur, and the alloy containing no more than about 0.01% by weight of other matter.

38. The method of producing an electrically negative conductor, which comprises forming a composition consisting essentially of lead and selenium in proportion of 72.45% to 75.0% by weight of lead, the balance substantially all selenium, and containing no more than about 0.01% by weight of other matter.

39. The method of producing an electrically negative conductor, which comprises forming a composition consisting essentially of lead and sulphur in proportion of 86.63% to 87.20% by weight of lead, the balance substantially all sulphur, and containing no more than about 0.01% by weight of other matter.

References Cited in the file of this patent

UNITED STATES PATENTS

| | | |
|---|---|---|
| 704,595 | Thwing | July 15, 1902 |
| 775,188 | Lyons | Nov. 15, 1904 |
| 2,397,756 | Schwartz | Apr. 2, 1946 |
| 2,685,608 | Justi | Aug. 3, 1954 |

OTHER REFERENCES

Lange, Bruno: "Photoelements and Their Application," Reinhold Publishing Corp., New York, 1938, pages 44–46.

Telkes, Maria: "The Efficiency of Thermoelectric Generators," Journal of Applied Physics, vol. 18, December 1947, pp. 1124–1127.

Zworykin, E. E., and Ramberg, E. G.: "Photoelectricity and its Application," John Wiley and Sons, New York, 1949, pp. 199–202.